United States Patent
Gardner et al.

[11] Patent Number: 5,962,914
[45] Date of Patent: Oct. 5, 1999

[54] REDUCED BIRD'S BEAK FIELD OXIDATION PROCESS USING NITROGEN IMPLANTED INTO ACTIVE REGION

[75] Inventors: Mark I. Gardner, Cedar Creek; Fred N. Hause, Austin, both of Tex.; Kuang-Yeh Chang, Los Gatos, Calif.

[73] Assignee: Advanced Micro Devices, Inc., Sunnyvale, Calif.

[21] Appl. No.: 09/168,761

[22] Filed: Oct. 8, 1998

Related U.S. Application Data

[62] Division of application No. 08/639,758, Jan. 14, 1998.

[51] Int. Cl.$^6$ ............................................. H01L 24/36
[52] U.S. Cl. .......................... 257/607; 438/528; 257/647
[58] Field of Search ................................ 257/607, 647; 438/225, 362, 426, 439, 443, 528

[56] References Cited

U.S. PATENT DOCUMENTS

| | | | |
|---|---|---|---|
| 4,098,618 | 7/1978 | Crowder et al. | 148/1.5 |
| 4,551,910 | 11/1985 | Patterson | 29/576 |
| 4,578,128 | 3/1986 | Mundt et al. . | |
| 4,682,407 | 7/1987 | Wilson et al. . | |
| 4,707,721 | 11/1987 | Ang et al. . | |
| 4,729,009 | 3/1988 | Ang . | |
| 4,743,566 | 5/1988 | Bastiaens et al. | 437/70 |
| 4,774,197 | 9/1988 | Haddad et al. . | |
| 4,776,925 | 10/1988 | Fossum et al. . | |
| 4,808,261 | 2/1989 | Ghidini et al. . | |
| 4,851,257 | 7/1989 | Young et al. . | |
| 4,866,002 | 9/1989 | Shizukuishi et al. . | |
| 4,897,365 | 1/1990 | Baldi et al. | 437/69 |
| 4,922,319 | 5/1990 | Fukushima . | |
| 5,043,780 | 8/1991 | Fazan et al. . | |
| 5,066,995 | 11/1991 | Young et al. . | |
| 5,082,797 | 1/1992 | Chan et al. . | |
| 5,102,832 | 4/1992 | Tuttle . | |
| 5,138,411 | 8/1992 | Sandhu . | |
| 5,141,882 | 8/1992 | Komori et al. . | |
| 5,158,463 | 10/1992 | Kim et al. . | |

(List continued on next page.)

FOREIGN PATENT DOCUMENTS

| | | |
|---|---|---|
| 0216246 | 4/1987 | European Pat. Off. . |
| 0532260 | 3/1993 | European Pat. Off. . |
| 3032608 | 3/1981 | Germany . |
| 5-283678 | 10/1993 | Japan . |
| 7-297298 | 11/1995 | Japan . |

OTHER PUBLICATIONS

Wolfe, S., "Silicon Processing For The VLSI Era," vol. 3: The Submicron MOSFET, Lattice Press, CA, 1985, pp. 495–496.

(List continued on next page.)

*Primary Examiner*—David B. Hardy
*Attorney, Agent, or Firm*—Conley, Rose & Tayon; Robert C. Kowert; Kevin L. Daffer

[57] ABSTRACT

A method of forming a self-aligned field oxide isolation structure without using silicon nitride. The method comprises forming a dielectric on an upper surface of a semiconductor substrate. The upper surface of the semiconductor substrate comprises an active region and an isolation region laterally adjacent to each other. A photoresist layer is patterned on top of the implant dielectric to expose regions of the implant dielectric over the active region. Nitrogen is then implanted into the active region through the implant dielectric. Nitrogen is preferably introduced into semiconductor substrate in an approximate atomic concentration of 0.5 to 2.0 percent. After the nitrogen has been implanted into a semiconductor substrate, the photoresist layer is stripped and the implant dielectric is removed. The wafer is then thermally oxidized such that a field oxide having a first thickness is grown over the isolation region and a thin oxide having a second thickness is grown over the active region. The presence of the nitrogen within the semiconductor substrate retards the oxidation rate of the silicon in the active region such that the thickness of the thin oxide is substantially less than the thickness of the thermal oxide. In a presently preferred embodiment, the field oxide has a thickness of 2,000 to 8,000 angstroms while the thin oxide has a thickness of less than 300 angstroms.

18 Claims, 2 Drawing Sheets

U.S. PATENT DOCUMENTS

| | | |
|---|---|---|
| 5,172,200 | 12/1992 | Muragishi et al. . |
| 5,191,509 | 3/1993 | Wen . |
| 5,208,176 | 5/1993 | Ahmad et al. . |
| 5,250,456 | 10/1993 | Bryant . |
| 5,254,489 | 10/1993 | Nakata . |
| 5,286,992 | 2/1994 | Ahrens et al. . |
| 5,308,787 | 5/1994 | Hong et al. . |
| 5,316,965 | 5/1994 | Philipossian et al. ............... 437/70 |
| 5,330,920 | 7/1994 | Soleimani et al. ............... 437/24 |
| 5,330,935 | 7/1994 | Dobuzinsky et al. . |
| 5,340,764 | 8/1994 | Larsen et al. . |
| 5,358,894 | 10/1994 | Fazan et al. . |
| 5,391,907 | 2/1995 | Jang ............... 257/396 |
| 5,432,114 | 7/1995 | O . |
| 5,480,828 | 1/1996 | Hsu et al. . |
| 5,502,009 | 3/1996 | Lin . |
| 5,576,226 | 11/1996 | Hwang . |
| 5,576,266 | 11/1996 | Flosenzier et al. . |
| 5,576,570 | 11/1996 | Ohsawa et al. . |
| 5,786,256 | 7/1998 | Gardner et al. . |
| 5,789,305 | 8/1998 | Peidous ............... 438/439 |
| 5,872,376 | 2/1999 | Gardner et al. . |
| 5,882,993 | 3/1999 | Gardner et al. ............... 438/591 |

OTHER PUBLICATIONS

Wolfe, et al., "Silicon Processing For The VLSI Era," vol. 1: Process Technology, Lattice Press, CA, 1986, pp. 429–446.

Wolf, "Silicon Processing for the VLSI Era, vol. 1, Process Technology,", pp. 198–218.

Molle, P. et al., "Nitrogen Implantation for Local Oxidation of Silicon," Nuclear Instruments & Methods in Physics Research, Section –B: Bean Interactions with Materials and Atoms, vol. B55, No. 1/04, Apr. 2, 1991, pp. 860–865.

Schott, K. et al., "Blocking of Silicon Oxidation by Low–Dose Nitrogen Implantation," Applied Physics A. Solids and Surfaces, vol. A45, No. 1, Jan. 1, 1988, pp. 73–76.

Patent Abstracts of Japan, Publication No. 01183844; Publication Date: Jul. 21, 1989; Application Date: Jan. 19, 1988; Application No.: 63008901.

Doyle, B. et al., "Simultaneous Growth of Different Thickness Gate Oxides in Silicon CMOS Processing," IEEE Electron Device Letters, vol. 16, No. 7, Jul. 1995, pp. 301–302.

Philipossian, A. et al., "Kinetics of Oxide growth During Reoxidation of Lightly Nitrided Oxides," J. Electrochem. Soc. V. 139, No. 9, Sep. 1992, pp. L82–3.

Ahn, J. et al., "High Quality Ultrathin gate Dielectrics Formation by Thermal Oxidation of Si in N20," J. Electrochem. Soc. V. 139, No. 9, Sep. 1991, pp. L39–41.

Kuroi, et al "Novel NICE Structure For High Reliability and High Performance 0.25 micron Dual Gate CMOS", IEDM, pp. 325–328.

Naito et al., "Effect of Bottom Oxide on the Integrity of Interpolysilicon Ultrathin ONO Films," *Journal of the Electrochemical Society*, vol. 137, No. 2, Feb. 1, 1990, pp. 635–638.

Abbas et al., "Improvement of the Gate–Region Integrity in FET Devices," *IBM Technical Disclosure Bulletin*, vol. 14, No. 11, Apr. 1972, pp. 3348–3350.

Cheung, "Plasma Immersion Ion Implantation for ULSI Processing," *Trends & Applications*, 1991, pp. 811–820.

Wolfe et al., "Silicon Processing for the VLSI Era, vol. 1, Process Technology," p. 321.

REDUCED BIRD'S BEAK FIELD OXIDATION PROCESS USING NITROGEN IMPLANTED INTO ACTIVE REGION

This application is a divisional of U.S. application Ser. No. 08/639,758, filed on Jan. 14, 1998 as a continued prosecution application of the same application number filed on Apr. 29, 1996.

BACKGROUND OF THE INVENTION

1. Field of the Invention

This invention relates to semiconductor fabrication and more particularly to an improved method for forming a field oxidation isolation structure by implanting nitrogen into the active regions.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS process involves oxidizing field regions between devices. The oxide grown in field regions are termed field oxide, wherein field oxide is grown during the initial stages of integrated circuit fabrication, before source and drain implants are placed in device areas or active areas. By growing a thick field oxide in field regions pre-implanted with a channel-stop dopant, LOCOS processing serves to prevent the establishment of parasitic channels in the field regions.

A conventional LOCOS process is shown in FIGS. 1–6. In FIG. 1, a thin oxide 12 is grown on a semiconductor substrate 10. A layer of silicon nitride, shown in FIG. 2 as layer 14, is then deposited on the thin oxide 12 with a chemical vapor deposition process. Photoresist is then deposited on the silicon nitride layer 14 and patterned to obtain a patterned photoresist layer 15 shown in FIG. 2. Photoresist layer 15 is patterned to define an active region 16 and a field region 18 in semiconductor substrate 10.

After patterning photoresist layer 15, silicon nitride layer 14 and thin oxide layer 12 are removed in regions where the photoresist has been removed. FIG. 3 shows the wafer after the exposed silicon nitride layer 14 and thin oxide layer 12 have been removed and photoresist layer 15 has been stripped. In FIG. 4, the wafer is inserted into a thermal oxidation tube to grow an oxide in field region 18 of semiconductor substrate 10. This thermal oxidation is represented in FIG. 4 as number 20. As is well known, the presence of silicon nitride layer 14 over active region 16 suppresses the growth of oxide in those regions. FIG. 5 shows a partial cross section of the wafer after completion of thermal oxidation 20. A thick field oxide 22 is present in field region 18 of semiconductor substrate 10 while a thin oxide 24 has been formed underneath silicon nitride layer 14 in active regions 16. A transition region between thick field oxide 22 and thin oxide 24 comprises the well known bird's beak 26. Bird's beak 26 extends into active region 16 by the amount $d_1$. Completion of the conventional field oxidation LOCOS process is accomplished by stripping the silicon nitride layer 14, removing thin oxide 24 with a wet etch process, growing a sacrificial oxide layer, and removing the sacrificial layer. The sacrificial oxide process is performed to eliminate the so called "Kooi" ribbons of silicon nitride that can form at the interface between thin oxide 24 and semiconductor substrate 10 during the field oxidation process. The sacrificial oxide layer is shown in phantom as a dashed line in FIG. 6.

While LOCOS has remained a popular isolation technology, there are several problems inherent with the conventional LOCOS process. First, a growing field oxide extends laterally as a bird's-beak structure. In many instances, the bird's-beak structure 26 can unacceptably encroach into the device active area 16.

In addition, it is well known that depositing CVD silicon nitride directly on a silicon surface results in a very high tensile stress that can exceed the critical stress for dislocation generation in silicon. This stress, which can create fabrication induced defects in the silicon substrate is believed to be caused by the termination of intrinsic stresses at the edges of the nitride film. To prevent this stress from affecting the semiconductor substrate 10, it is necessary in the LOCOS process to form the thin oxide layer 12, commonly referred to as a buffer oxide layer, thereby adding complexity and expense to the process.

Still further, the removal of silicon nitride layer 14 after formation of field oxide 22 is known by those skilled in the art of semiconductor processing to generate a large number of particles. When silicon nitride layer 14 is subjected to the high temperatures used to grow field oxide 22, a thin film forms on an upper surface of silicon nitride layer 14. The thin film is believed to comprise a composite of silicon, oxygen, and nitrogen ($Si_xO_yN_z$). Removal of this film from the upper surface of silicon nitride layer 14 requires additional processing steps. Instead of simply immersing the wafer in a hot phosphoric acid solution, as is commonly done to wet etch silicon nitride layers, a brief plasma etch must be performed to remove the $Si_xO_yN_z$ film from the upper surface of silicon nitride layer 14. In addition to undesirably removing oxide from an upper surface of field oxide 22, this plasma etch process is known to generate a large number of particles. These particles can become lodged on the silicon surface that can result in defective devices. Finally, the conventional LOCOS process requires a sacrificial oxide to remove the Kooi ribbons as described above. The formation and removal of the sacrificial oxide layer adds additional processing time and expense to the conventional LOCOS process. In addition, the sacrificial oxide is generally over-etched to ensure that all traces of silicon nitride formed during the field oxidation process are removed. The over-etch undesirably reduces the thickness of the field oxide 22.

Therefore, it would be highly desirable to implement a field oxidation process sequence which eliminated the need to deposit a silicon nitride layer on the wafer surface. By eliminating the nitride deposition step, such a process would thereby eliminate the high particle counts associated with the nitride strip process and would eliminate the field oxide etch back cycle required in conventional field oxidation process sequences. Further, the elimination of the nitride deposition from the field oxidation process would eliminate the need to grow the Kooi oxide after removal of the nitride layer. In addition, the bird's beak structure and the encroachment problems associated with conventional field oxidation processes would be substantially reduced.

SUMMARY OF THE INVENTION

The problems identified above are in large part resolved by a semiconductor process in which field oxidation is accomplished without the use of the silicon nitride layer. The improved process hereof incorporates nitrogen into the silicon substrate instead of placing a layer of nitride on an oxide layer above the silicon substrate. The nitrogen is placed in the active region of the silicon substrate prior to the formation of the field oxide. The presence of nitrogen in selected regions of the silicon substrate serves to reduce the oxidation rate of the silicon in those regions. Thus, during the formation of the field oxide, the oxidation rate in the "nitrogenated" regions of the silicon substrate is less than the oxidation rate in regions lacking nitrogen. The higher oxidation rate in the non-nitrogenated regions results in a sharply delineated field oxide structure in which the bird's beak is substantially eliminated.

Broadly speaking, the present invention comprises a method of forming a self-aligned field oxide. A dielectric is formed on an upper surface of a semiconductor substrate comprising an active region and an isolation region. A photoresist layer is patterned on the dielectric layer to expose regions of the dielectric layer over active regions of the silicon substrate. Nitrogen is then implanted into the active regions of the silicon substrate through the exposed dielectric layer. The photoresist is then stripped and the dielectric layer removed from the wafer. In a presently preferred embodiment, the dielectric layer is comprised of a thermal oxide and removal of the dielectric layer is accomplished with a wet etch process. Next, the wafer is subjected to a thermal oxidation process whereby a field oxide grows over the isolation regions of the silicon substrate and a thin oxide grows over the active regions due to the lower oxidation rate of the nitrogenated silicon.

In a presently preferred embodiment, nitrogen is present in the active regions of the semiconductor substrate in an atomic percentage of approximately 0.5 to 2.0 percent. Preferably, nitrogen is implanted into the semiconductor substrate using a nitrogen dose of approximately $5\times10^{13}$ to $5\times10^{16}$ ions/cm$^2$. The field oxidation is preferably accomplished at a temperature of 900 to 1150° C. to achieve a field oxide thickness of approximately 2,000 to 8,000 angstroms. A channel stop implant can be performed before or after formation of the field oxide. In CMOS processes, separate channel stop implants can be performed for each well.

The present invention further contemplates a method for forming a self-aligned field oxide wherein the field oxide has a transition region that encroaches upon the active area by a distance of less than 0.05 microns.

The present invention still further contemplates a semiconductor substrate comprising an active region and an isolation region. The active region contains approximately 0.5 to 2.0 percent nitrogen and the isolation region, which is laterally adjacent to the active region, comprises a thermal oxide formed on the semiconductor substrate.

BRIEF DESCRIPTION OF THE DRAWINGS

Other objects and advantages of the invention will become apparent upon reading the following detailed description and upon reference to the accompanying drawings in which.

Figure 1:
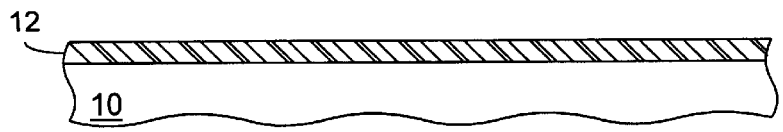
FIG. 1 is a partial cross-sectional view of a semiconductor substrate upon which a thin oxide has been grown.
Figure 2:
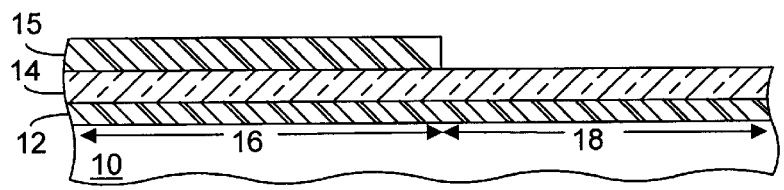
FIG. 2 is a processing step subsequent to that shown in FIG. 1, in which a silicon nitride layer has been formed on the thin oxide layer and a photoresist layer has been patterned on top of the silicon nitride layer to define active regions and isolation regions.
Figure 3:
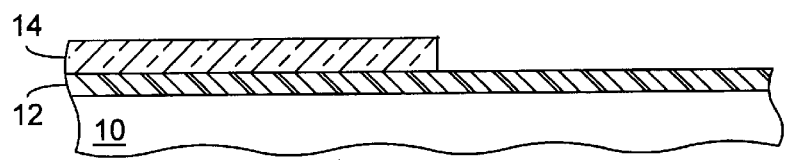
FIG. 3 is a processing step subsequent to that shown in FIG. 2, in which the silicon nitride layer and the thin oxide layer over the isolation region have been etched and the photoresist layer has been stripped.
Figure 4:
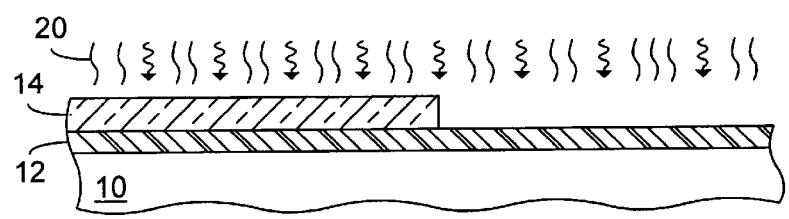
FIG. 4 is a processing step subsequent to that shown in FIG. 3, in which the wafer is subjected to a thermal oxidation step.
Figure 5:
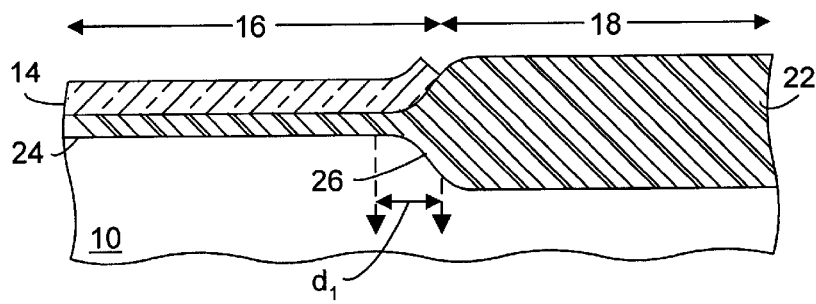
FIG. 5 is a processing step subsequent to that shown in FIG. 4 depicting the field oxide and thin oxide formed in the thermal oxidation step.
Figure 6:
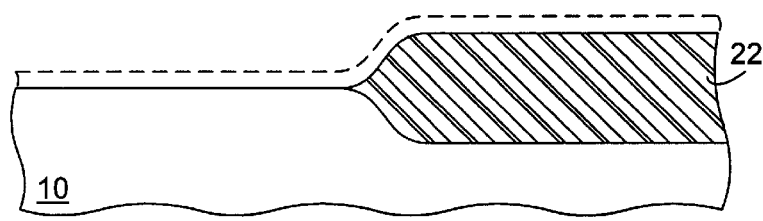
FIG. 6 is a processing step subsequent to that shown in FIG. 5 in which the silicon nitride layer has been stripped and the thin oxide removed.
Figure 7:
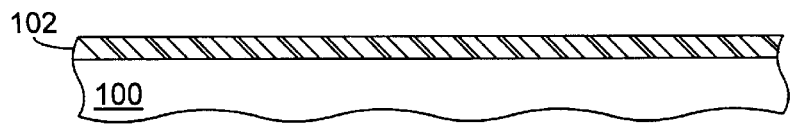
FIG. 7 is a partial cross-sectional view of a semiconductor wafer upon which a dielectric has been formed.

While the invention is susceptible to various modifications and alternative forms, specific embodiments whereof are shown by way of example and the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 9:
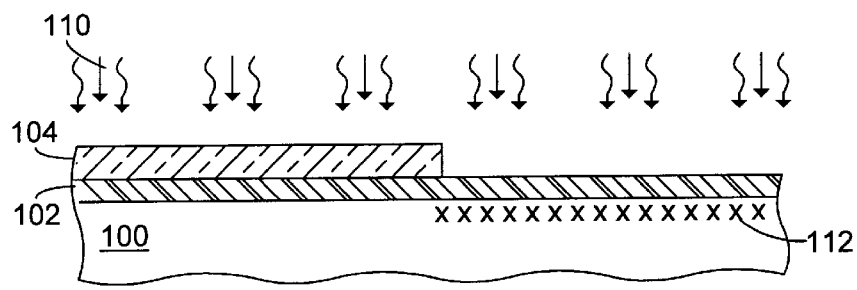
FIG. 9 is a processing step subsequent to FIG. 8 in which nitrogen has been implanted into the silicon substrate within the active region bound by the patterned photoresist.
Figure 10:
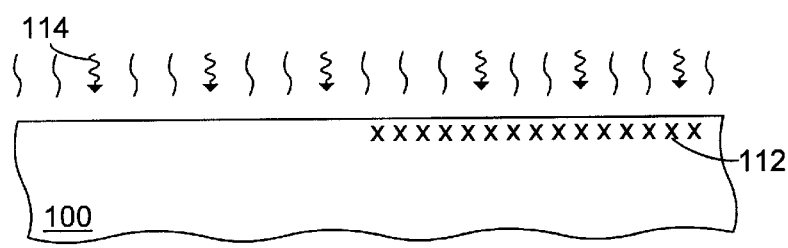
FIG. 10 is a processing step subsequent to FIG. 9 in which the dielectric layer and the photoresist layer have been removed and the wafer subjected to a thermal oxidation.
Figure 11:
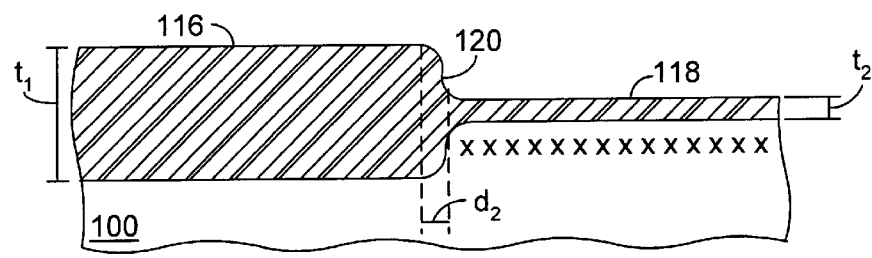
FIG. 11 is a partial cross-sectional view of the wafer after completion of the thermal oxidation structure of FIG. 10.
Figure 12:
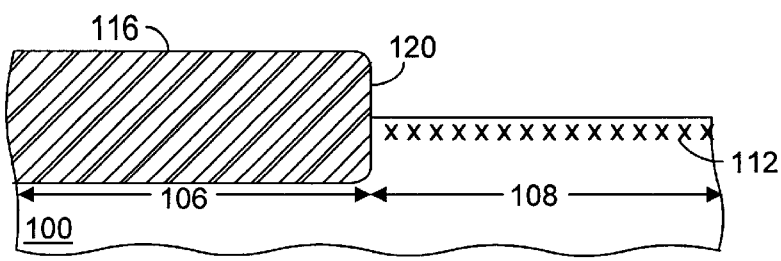
FIG. 12 is a processing step subsequent to FIG. 11 in which the thin oxide over the active region has been removed.

Turning now to FIGS. 7–12, an improved process sequence for forming a field oxide isolation structure is shown. Turning briefly to FIG. 12, isolation structure 116 is shown. Isolation structure 116 is comprised within an isolation region 106 within semiconductor substrate 100. Active region 108 includes nitrogen 112 incorporated into semiconductor substrate 100. In a presently preferred embodiment, nitrogen 112 is present in an atomic percentage of approximately 0.5 to 2.0 percent. Isolation region 106 is laterally adjacent to active region 108 and comprises a field oxide grown to form structure 116. Field oxide structure 116 comprises a sidewall 120 which extends substantially perpendicularly from an upper surface of semiconductor substrate 100. Substantially perpendicular sidewall 120 ensures that field oxide 116 encroaches upon active region 108 by a distance less than or equal to $d_2$, which is shown in FIG. 11. In a presently preferred embodiment, $d_2$ is approximately 0.05 microns or less.

Figure 8:
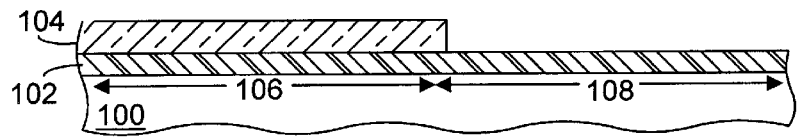
FIG. 8 is a processing step subsequent to that shown in FIG. 7 in which a photoresist layer has been patterned onto the dielectric layer to define an active region and an isolation region.

Returning now to FIG. 7, a partial cross-section view of a semiconductor substrate 100 is shown. Dielectric 102 is formed upon the semiconductor substrate 100. Dielectric 102 is suitably comprised of a deposited or grown oxide having a thickness from 50 to 500 angstroms. Referring to FIG. 8, photoresist layer 104 is patterned on dielectric layer 102. Photoresist layer 104 is patterned such that the region of dielectric layer 102 above field region 108 of semiconductor substrate 100 is exposed. Depositing and patterning of photoresist layer 104 is preferably accomplished with photolithography steps well known in the art of semiconductor processing. After patterning of photoresist layer 104 is completed, nitrogen is implanted into active region 108 of semiconductor substrate 100 as shown in FIG. 9. In FIG. 9, the implanting of nitrogen is represented by arrows 110 while the implanted nitrogen within semiconductor substrate 100 is represented by the "X's" 112.

FIG. 10 shows a processing step subsequent to FIG. 9 after dielectric layer 102 and photoresist layer 104 have been removed and the wafer inserted into a thermal oxidation tube. The thermal oxidation is represented in FIG. 10 by wavy lines 114. The introduction of low levels of nitrogen into a silicon substrate is believed to retard the rate at which the silicon oxidizes. Accordingly, oxidation of semiconductor substrate occurs at a greater rate in isolation region 106, which is absent implanted nitrogen 112, than in active region 108. In a presently preferred embodiment, thermal oxidation 114 is formed at a temperature of 900 to 1150° C. and can be performed in either an $O_2$ (dry) or $H_2O$ (wet) ambient. FIG. 11 shows a partial cross section of the semiconductor substrate after completion of thermal oxidation 114. Field oxide 116, having a first thickness $t_1$ has been formed over isolation region 106 while thin oxide 118 having a second thickness $t_2$ is formed over active region 108. The oxidation rate in the nitrogenated region of semiconductor substrate 100 is believed to correspond to the amount of nitrogen present in semiconductor substrate 100. Thus, controlling the dosage of nitrogen implant 110 controls the oxidation rate of the silicon within active region 108 and thus controls the final thickness $t_2$ of thin oxide 118. In a presently preferred embodiment, thickness $t_2$ of thin oxide 118 is less than 300 angstroms while the thickness $t_1$ of field oxide 116 is 2,000–8,000 angstroms.

The use of nitrogen implant 110 to control the oxidation rate of silicon substrate 100 within active region 108 is also believed to substantially eliminate formation of the bird's beak structure routinely encountered in conventional LOCOS processing using silicon nitride. It is believed that the present method is capable of growing a field dielectric structure 116 adjacent to an active region 108 wherein a sidewall 120 of the field structure 116 is substantially perpendicular to an upper surface of semiconductor substrate 100. Thus, the distance $d_2$, which represents the amount by which field oxide 116 encroaches upon active region 108, is minimized. In the presently preferred embodiment, the encroachment $d_2$ is less than or equal to 0.05 microns. Returning now to FIG. 12, the isolation structure 116 is shown after removal of thin oxide 118 from the upper surface of semiconductor substrate 100. In addition to enabling differential oxidation rates within semiconductor substrate 100, the presence of nitrogen species 112 within semiconductor substrate 100 is believed to provide a barrier layer for fast diffusers such as boron and sodium. Further, the presence of nitrogen species 112 is believed to enhance the quality of the process gate oxide producing higher strength bonds with subsequently formed oxides. A channel stop implant (not shown) can be performed before or after formation of the structure shown in FIG. 12. Using commercially available MeV implanters, channel stop implants may be done post-field oxidation. In CMOS processes, separate channel stop implants can be performed on each well.

As will be obvious to one skilled in the art having the benefit of this disclosure, the process sequence depicted in FIGS. 7–12 is capable of producing an isolation structure within a semiconductor substrate. It will be further appreciated that the isolation structure of the present invention substantially eliminates encroachment due to bird's beak formation. It will be still further appreciated that by eliminating deposition of a silicon nitride layer from the isolation process, the process sequence is simplified.

It is to be understood that the form of the invention shown and described in the detailed description and the drawings is to be taken merely as presently preferred examples of how a field oxide isolation structure can be formed without silicon nitride and without substantial encroachment due to bird's beak formation. Obvious variations of the method disclosed would be apparent to those skilled in the art having the benefit of this disclosure. For example, thin oxide 118 shown in FIG. 11 could be removed with a wet or dry etch process. As another example, photoresist layer 104 in FIGS. 8 and 9 is used to mask the nitrogen implant 110 whereas other suitable materials may be used to form this masking function including polysilicon, for example. It is intended that following claims be interpreted broadly to embrace all these variations of the preferred embodiments disclosed.

What is claimed is:

1. A semiconductor substrate comprising:
   an active region within a semiconductor substrate, wherein said active region contains approximately 0.5 to 2.0 percent nitrogen within a thickness less than 200 angstroms of a surface of said semiconductor substrate; and
   an isolation region within said semiconductor substrate, laterally adjacent to said active region, wherein said isolation region comprises a thermal oxide formed on said semiconductor substrate.

2. The semiconductor substrate of claim 1 wherein said thermal oxide has a thickness of approximately 2000 to 8000 angstroms and further wherein said thermal oxide includes a sidewall, proximal to said active region, extending substantially perpendicularly from an upper surface of said semiconductor substrate.

3. The semiconductor substrate of claim 1 wherein said thermal oxide encroaches upon said active region by a distance less than 0.05 microns.

4. A semiconductor topography, comprising:
   an active region of a semiconductor substrate having nitrogen implanted within an upper surface of the substrate across the entire active region; and
   an isolation region comprising a thermal oxide self-aligned to the implanted nitrogen in said active region.

5. The semiconductor topography as recited in claim 4, wherein the semiconductor substrate below said thermal oxide in said isolation region is absent said implanted nitrogen.

6. The semiconductor topography as recited in claim 4, wherein said thermal oxide is substantially absent a bird's beak structure at an interface between said isolation region and said active region.

7. The semiconductor topography as recited in claim 4, wherein said thermal oxide has a sidewall self-aligned to the implanted nitrogen in said active region, wherein said sidewall is substantially perpendicular to the upper surface of the semiconductor substrate.

8. The semiconductor topography as recited in claim 4, wherein said thermal oxide has a thickness of approximately 2000 to 8000 angstroms.

9. The semiconductor topography as recited in claim 4, wherein a concentration of the implanted nitrogen in said active region is approximately 0.5 to 2.0 percent.

10. The semiconductor topography as recited in claim 4, wherein the implanted nitrogen in said active region extends less than 200 angstroms below the upper surface of the semiconductor substrate.

11. A field oxide formed by the method comprising:

implanting nitrogen into an active region of an upper surface of a semiconductor substrate, wherein said nitrogen is not implanted into an isolation region adjacent said active region;

thermally oxidizing the upper surface of said semiconductor substrate to grow a field oxide having a first thickness over said isolation region and a thin oxide having a second thickness over said active region, wherein said nitrogen implanted in said active region reduces the oxidation rate in said active region so that said first thickness is greater than said second thickness; and removing said thin oxide.

12. The field oxide as recited in claim 11, the method further comprising forming an implant dielectric over said active region prior to said implanting.

13. The field oxide as recited in claim 12, the method further comprising removing said implant dielectric over said active region after said implanting.

14. The field oxide as recited in claim 11, the method further comprising:

depositing a photoresist layer over said active region and said isolation region; and prior to said implanting, patterning said photoresist layer wherein said photoresist layer over said active region is removed and said photoresist layer over said isolation region remains.

15. The field oxide as recited in claim 14, the method further comprising removing said photoresist layer over said isolation region after said implanting.

16. The field oxide as recited in claim 11, wherein said field oxide is grown without an oxidation mask present over said active region.

17. The field oxide as recited in claim 11, wherein said implanting results in nitrogen present throughout said active region in an atomic percentage of approximately 0.5 to 2.0 percent within a thickness less than 200 angstroms of the surface of said semiconductor substrate.

18. The field oxide as recited in claim 11, wherein said implanting is performed with a nitrogen dose of approximately $5 \times 10^{13}$ to $5 \times 10^{16}$ ions/cm$^2$.

* * * * *